United States Patent [19]
Kanda et al.

[11] Patent Number: 5,731,128
[45] Date of Patent: Mar. 24, 1998

[54] RESIN COMPOSITION FOR FLEXOGRAPHIC PRINTING PLATE

[75] Inventors: Kazunori Kanda, Yao; Koichi Ueda, Neyagawa; Tadahiro Kakiuchi, Kawanishi; Hisaichi Muramoto, Hirakata; Hozumi Sato, Tsukuba; Katsuo Koshimura; Takashi Nishioka, both of Yokkaichi, all of Japan

[73] Assignees: Nippon Paint Co., Ltd., Osaka-fu; Japan Synthetic Rubber Co., Ltd., Tokyo-to, both of Japan

[21] Appl. No.: 564,729

[22] Filed: Nov. 29, 1995

[30] Foreign Application Priority Data

Nov. 29, 1994 [JP] Japan .................................. 6-294456

[51] Int. Cl.$^6$ .............................. G03F 7/032; G03F 7/30; B32B 5/16
[52] U.S. Cl. .................... 430/281.1; 430/306; 430/18; 428/402; 428/402.24; 525/330.1; 525/385; 525/329.9; 525/130; 525/374; 525/331.9; 525/330.9; 525/329.4; 525/327.4; 525/123; 525/327.7; 525/327.6; 525/332.2; 525/330.8
[58] Field of Search .................... 525/330.1, 385, 525/329.9, 130, 374, 331.9, 330.9, 329.4, 327.4, 123, 327.7, 327.6, 332.2, 330.8; 428/402.24, 402; 430/281.1, 306, 18

[56] References Cited

U.S. PATENT DOCUMENTS

| | | | |
|---|---|---|---|
| 4,647,610 | 3/1987 | Sperry et al. | 524/385 |
| 5,008,337 | 4/1991 | Patel | 525/130 |
| 5,175,076 | 12/1992 | Ishikawa et al. | 430/281.1 |
| 5,244,737 | 9/1993 | Anderson et al. | 428/402 X |
| 5,344,744 | 9/1994 | Ueda et al. | 430/281.1 |
| 5,622,813 | 4/1997 | Kanda et al. | 430/281.1 |

FOREIGN PATENT DOCUMENTS

| | | | |
|---|---|---|---|
| 45-13233 | 5/1970 | Japan | 525/385 |
| 54-037189 | 3/1979 | Japan | 525/385 |
| 3-26716A | 2/1991 | Japan | 525/385 |

OTHER PUBLICATIONS

Jin et al, Chemical Abstracts 113:192 587 of Shanghai Keji Daxue Xuebao (1989), 12(4), 77–82.

*Primary Examiner*—Cynthia Hamilton
*Attorney, Agent, or Firm*—Wenderoth, Lind & Ponack

[57] ABSTRACT

The present invention provides a resin composition for flexographic printing plate, which is superior in rubber elasticity, hardness and elongation as well as water developability. The resin composition for flexographic printing plate capable of water developing, attains excellent rubber elasticity, hardness and elongation without deterioration of water developability, using as elastic particles copolymer elastic particles having whisker on the particle surface which forms an entanglement between particles.

21 Claims, No Drawings

RESIN COMPOSITION FOR FLEXOGRAPHIC PRINTING PLATE

FIELD OF THE INVENTION

The present invention relates to a photosensitive resin composition having good water developability. More particularly, it relates to a photosensitive resin composition using elastic copolymer particles, which satisfies both elasticity and elongation.

BACKGROUND OF THE INVENTION

Heretofore, various photosensitive resin compositions have widely been used in the fields of photoresist, printing and the like.

Examples of the photosensitive resin compositions are a composition containing a cyclized rubber and a bisazide compound; compositions containing a thermoplastic elastomer, an acrylic monomer and a photopolymerization initiator; and a composition containing as a base photosensitive resin such as polyester acrylate, epoxy acrylate, polyvinyl cinnamate, chloromethylated polystyrene, aromatic azide group-containing resin, etc. These photosensitive resin compositions, however, are insoluble in water, and an organic solvent has to be used as developer. However, the use of an organic solvent not only causes problems of safety and human health when working, but also badly affects the environment.

In order to solve the problems, an alkaline developable photosensitive resin composition containing a combination of a novolac resin or poly(vinylphenol) with a quinonediazide compound is known. Also, a water developable photosensitive resin composition which is capable of developing with water, which is safe and easily treated, has been proposed. Examples thereof are a composition comprising a water-soluble resin (e.g. poly(vinyl alcohol), gelatin, casein, etc.) and a bichromate salt, a diazonium salt or a bisazide compound; a composition of a water-soluble resin, a water-soluble acrylic monomer and a photopolymerization initiator; and the like. However, the conventional water developable photosensitive resin composition, after curing, swells itself at the time of development to cause a decrease in strength or a change in size, since the base resin has strong affinity to water. As a result, there are problems such as deterioration of dimensional accuracy of the resist, deterioration of printing quality, etc.

In order to solve the problems, the present inventors have already proposed some water developable photosensitive resin compositions. One of them is a composition which comprises (i) a partially crosslinked copolymer of an aliphatic conjugate diene, an α,β-ethylenically unsaturated carboxylic acid and a polyfunctional vinyl compound, which is soluble in an aqueous alkaline solution, (ii) a photopolymerizable unsaturated monomer and (iii) a photopolymerization initiator (iii) (e.g. see Japanese Laid-Open Patent Publication Nos. 60-179411, 60-219208 and 61-181811). In addition, another example is a water developable resin composition which comprises (i) a partially crosslinked copolymer obtained by emulsion polymerizing an aliphatic conjugate diene, an α,β-ethylenically unsaturated carboxylic acid and a compound containing at least two addition-polymerizable groups, (ii) an aliphatic conjugate diene polymer, (iii) a photopolymerizable unsaturated monomer, (iv) a basic nitrogen atom-containing compound and (v) a photopolymerization initiator (e.g. see Japanese Laid-Open Patent Publication No. 1-300246). However, the above proposed water developing photosensitive resin compositions are desired to further improve the strength of the resin plate after photo-curing.

It is also proposed that various physical properties and water resistance required for a photosensitive resin composition can be improved by reactive microfine particles obtained by chemically modifying a crosslinked copolymer prepared by emulsion polymerization (e.g. see Japanese Laid-Open Patent Publication No. 62-84113). However, it is difficult to impart the requisite water developability and elasticity in the composition.

It is also known that one of the important properties for flexographic printing materials is a coexistence of rubber elasticity and elongation. It is also necessary to shorten the water developing time when plate making. Heretofore, various techniques for satisfying the above mentioned properties have been developed for water developable photosensitive resin compositions, using inner-crosslinked diene copolymer particles.

Japanese Laid-Open Patent Publication No. 5-023539 also proposes to use elastic copolymer particles having photoreactivity so as to attain high performances required for the printing plate materials. Toughness of the printing plate material is sufficiently increased by using the reactive elastic particles and is superior in plate wear required for the printing plate. However, it raises different problems in physical properties (e.g. increase of hardness and increase of initial young's modulus by crosslinking), deterioration of water developability, etc.

OBJECTS OF THE INVENTION

The present inventors have studied intensively in order to solve the above problem, that is, to satisfy both rubber elasticity and elongation, the flexographic printing material capable of water developing without deterioration of water developability. As a result, it has been found that, there can be obtained a resin composition for flexographic printing plate capable of water developing, which attains excellent rubber elasticity, hardness and elongation without deterioration of water developability, by using elastic copolymer particles having whiskers on the particle surface which form an entanglement on the particle surface between particles.

The main object of the present invention is to provide a resin composition for flexographic printing plate, which is superior in rubber elasticity, hardness and elongation as well as water developability.

This object as well as other objects and advantages of the present invention will become apparent to those skilled in the art from the following description.

SUMMARY OF THE INVENTION

That is, the present invention provides a resin composition for flexographic printing plate, comprising:

(1) a particulate copolymer which is surface-modified by reacting a carboxyl group-containing particulate copolymer with a side chain-forming compound containing a functional group reactive with a carboxyl group and a branched- or straight-chain saturated hydrocarbon group having 1 to 24 carbon atoms, said caroxyl group-containing particulate copolymer being obtained by polymerizing a monomer mixture containing (i) 10 to 95 molar % of an aliphatic conjugate diene, (ii) 0.1 to 30 molar % of a carboxyl group-containing ethylenically unsaturated monomer, (iii) 0.1 to 20 molar % of a compound containing at least two polymerizable unsaturated groups and (iv) 0 to 30 molar % of a polymerizable monomer other than the monomers (i)–(iii) (provided that the total amount of the components (i), (ii), (iii) and (iv) is 100 molar %);

(2) a photopolymerizable unsaturated monomer;

(3) an amino group-containing compound; and (4) a photopolymerization initiator.

The above problem has been solved by a flexographic printing plate comprising the above composition.

DETAILED DESCRIPTION OF THE INVENTION

There could be obtained a resin composition for flexographic printing plate, which is superior to a conventional product in rubber elasticity, hardness and elongation among physical properties required exceedingly for the water developing type flexographic printing plate, and which is also equivalent or superior to a conventional one in water developability, by modifying the surface of the particulate copolymer (1) with a compound having no photopolymerizability. The reason why these various physical properties are improved by the modification is not apparent, but is considered as follows. That is, pseudo-network (described in "Physical Properties of Polymer" written by Junji FURUKAWA, published by Kagaku Dojin) due to entanglement between particulate copolymers is formed by the modification of the surface of the particulate copolymer (1) and the entanglement of molecular chains by the pseudo-network gets loose by a share such as tension and, therefore, the elongation can be increased without increasing initial young's modulus and tensile strength in comparison with the conventional system wherein a crosslinked bond between particles due to a photosensitive group arises.

Hereinafter, the present invention will be explained in detail.

(Component (1))

Firstly, the component (1) constituting the resin composition for flexographic printing plate material of the present invention is a particulate copolymer, which is obtained by copolymerising a monomer mixture of (i) an aliphatic conjugate diene (ii), a carboxyl group-containing ethylenically unsaturated monomer, (iii) a compound containing at least two polymerizable unsaturated groups as an essential component, and optionally (iv) a copolymerizable monomer other than the monomers (i), (ii) and (iii) to produce a carboxyl group-containing particulate copolymer, and then reacting the copolymer with a compound for forming wiskers (i.e. side chains) which has a functional group reactive with a carboxylic group. The resulting copolymer is hereinafter referred to as a "surface-modified copolymer".

In the above monomer mixture, the amount of the aliphatic conjugate diene (i) is 10 to 95 molar %, preferably 30 to 90 molar %; the amount of the carboxyl group-containing ethylenically unsaturated monomer (ii) is 0.1 to 30 molar %, preferably 0.1 to 20 molar %; and the amount of the compound containing at least two polymerizable unsaturated groups (iii) is 0.1 to 20 molar %, preferably 0.5 to 10 molar %. When the amount of the aliphatic conjugate diene (i) is less than 10 molar % the strength of the resin composition for flexographic printing plate material after photo-curing is decreased. On the other hand, when it exceeds 95 molar %, the water developability of the resin composition is insufficient. In addition, when the amount of the carboxyl group-containing ethylenically unsaturated monomer (ii) is less than 0. 1 molar %, the water developability of the resin composition is insufficient. On the other hand, when it exceeds 30 molar %, the resin composition after photo-curing is brittle and the water resistance is also deteriorated. When the amount of the compound containing at least two polymerizable unsaturated groups (iii) is less than 0.1 molar %, the water developability of the resin composition is insufficient. On the other hand, when it exceeds 20 molar % the compatibility between the surface-modified particulate copolymer (1) and photopolymerizable unsaturated monomer (2) is deteriorated and the processability of the resin composition for flexographic printing plate is insufficient and, a decrease in strength after photocuring is large. In addition, the amount of the other polymerizable monomer (iv), which is optionally used in the present invention, is not more than 30 molar %, preferably 1 molar % to 20 molar %.

Examples of the aliphatic conjugate diene (i) include butadiene, isoprene, 1,3-pentadiene, 1,3-hexadiene, 2,3-dimethylbutadiene, 4,5-diethyl-1,3-octadiene, 3-butyl-1,3-octadiene, chloroprene, 2,3-dichlorobutadiene, 1,3-cyclopentadiene or a combination thereof.

Examples of the carboxyl group-containing ethylenically unsaturated monomer (ii) include α,β-ethylenically unsaturated monocarboxylic acids, such as (meth)acrylic acid, crotonic acid, cinnamic acid, etc.; α,β-ethylenically unsaturated polycarboxylic acids, such as itaconic acid, itaconic anhydride, maleic acid, maleic anhydride, fumaric acid, citraconic acid, mesaconic acid, etc.; free carboxyl group-containing esters, such as monomethyl ester, monoethyl ester or monopropyl ester of the above α,β-ethylenically unsaturated polycarboxylic acids; free carboxyl group-containing nitrile compounds, such as mononitrile derivatives of the above α,β-ethylenically unsaturated polycarboxylic acids, etc.; free carboxyl group-containing amide compounds, such as monoamide derivatives of the above α,β-ethylenically unsaturated polycarboxylic acids, etc.; free carboxyl group-containing hydroxyalkyl esters, such as mono(2-hydroxyethyl ester) or mono(2-hydroxypropyl ester) of the above α,β-ethylenically unsaturated polycarboxylic acids, etc.; hydroxyl group-containing compounds, such as N-hydroxyalkyl derivatives of the above free carboxyl group-containing amide compounds; free carboxyl group-containing unsaturated alcohol esters of polyhydric carboxylic acids, such as monovinyl succinate, monoallyl succinate, monovinyl adipate, monoallyl adipate, monovinyl phthalate, monoallyl phthalate, etc.; or a combination thereof.

Examples of the compound containing at least two polymerizable unsaturated groups (iii) include di(meth)acrylates of alkylene glycols such as ethylene glycol, propylene glycol, 1,4-butanediol, 1,5-pentanediol, 1,6-hexanediol, etc.; di(meth)acrylates of alkylene glycols such as polyethylene glycol, polypropylene glycol, 1,4-butanediol, 1,5-pentanediol, 1,6-hexanediol, etc.; di(meth)acrylates of polymers having hydroxyl groups at both terminal ends, such as both terminal hydroxypolybutadiene, both terminal hydroxypolyisoprene, both terminal hydroxybutadiene-acrylonitrile copolymer, both terminal hydroxypolycaprolactone, etc.; oligo(meth)acrylates such as di(meth)acrylate, tri(meth)acrylate or tetra(meth)acrylate of polyhydric (trihydric or more) alcohols, e.g. glycerin, 1,2,4-butanetriol, trimethylolalkane (e.g. alkane having 1 to 3 carbon atoms), tetramethylolalkane (e.g. alkane having 1 to 3 carbon atoms), pentaerythritol, etc.; oligo(meth)acrylates of polyalkylene glycol adducts of polyhydric (trihydric or more) alcohols; oligo(meth)acrylates of cyclic polyhydric alcohols such as 1,4-cyclohexanediol, 1,4-benzenediol, etc.; oligo(meth)acrylate prepolymers such as polyester (meth) acrylate, epoxy (meth)acrylate, urethane (meth)acrylate, alkyd resin (meth)acrylate, silicone resin (meth)acrylate, spiran resin (meth)acrylate, etc.; bis(meth)acrylamides such as N,N-methylenebis (meth)acrylamide, N,N-ethylenebis (meth)acrylamide, N,N-hexamethylenebis (meth) acrylamide, etc.; polyvinyl aromatic compounds such as divinylbenzene, diisopropenylbenzene, trivinylbenzene, etc.; unsaturated alcohol esters of polyhydric carboxylic acids, such as divinyl phthalate, diallyl phthalate, etc.; polyfunctional unsaturated ethers such as divinyl ether, diallyl ether, etc.; or a combination thereof.

The other copolymerizable monomer (iv) is not specifically limited as long as it has copolymerizability with the monomers (i)–(iii) and examples thereof include styrene, α-methylstyrene, o-methylstyrene, m-methylstyrene, p-methylstyrene, p-t-butylstyrene, o-chlorostyrene, m-chlorostyrene, p-chlorostyrene, 1,1-diphenylethylene, N,N-dimethyl-p-aminostyrene, N,N-diethyl-p-aminostyrene, vinylpyridine, vinylpiperidine, vinylpyrrolidone, (meth)acrylonitrile, α-chloroacrylonitrile, α-chloromethylacrylonitrile, α-methoxyacrylonitrile, α-ethoxyacrylonitrile, nitrile crotonate, nitrile cinnamate, dinitrile itaconate, dinitrile maleate, dinitrile fumarate, (meth)acrylamide, crotonamide, cinnamamide, methyl (meth)acrylate, ethyl (meth)acrylate, n-butyl (meth)acrylate, isobutyl (meth)acrylate, sec-butyl (meth)acrylate, t-butyl (meth)acrylate, n-amyl (meth)acrylate, n-octyl (meth) acrylate, 2-ethylhexyl (meth)acrylate, lauryl (meth)acrylate, stearyl (meth)acrylate, methyl crotonate, ethyl crotonate, propyl crotonate, butyl crotonate, methyl cinnamate, ethyl cinnamate, propyl cinnamate, butyl cinnamate, dimethyl itaconate, diethyl itaconate, dimethyl maleate, diethyl maleate, dimethyl fumarate, diethyl fumarate, vinyl chloride, vinylidene chloride, vinyl acetate, allyl acetate, etc.; hydroxyl group-containing monomers, such as N-hydroxymethyl (meth)acrylamide, N-(2-hydroxyethyl) (meth)acrylamide, N,N-bis(2-hydroxyethyl) (meth) acrylamide, 2-hydroxyethyl (meth)acrylate, 2-hydroxypropyl (meth)acrylate, 2-hydroxyethyl crotonate, 2-hydroxypropyl crotonate, 2-hydroxyethyl cinnamate, 2-hydroxypropyl cinnamate, N-hydroxymethylamide crotonate, N-(2-hydroxyethyl)amide cinnamate, allyl alcohol, o-hydroxystyrene, m-hydroxystyrene, p-hydroxystyrene, ethylene glycol mono(meth)acrylate, propylene glycol mono(meth)acrylate, etc.; amino group-containing monomers such as vinylamine, allylamine, o-aminostyrene, m-aminostyrene, p-aminostyrene, 2-aminoethyl (meth)acrylate, 2-aminopropyl (meth) acrylate, etc.; epoxy group-containing monomers such as glycidyl (meth)acrylate, allylglycidyl ether, etc.; carbonyl group-containing monomers, such as acrolein, vinyl methyl ketone, etc.; or a combination thereof.

In the present invention, the copolymerization of the monomer mixture of the monomer components (i) to (iii), which optionally contains (iv), can be carried out by a suitable method such as emulsion polymerization, suspension polymerization, solution polymerization in an organic medium, bulk polymerization, etc. Preferred copolymerization is the emulsion polymerization or suspension polymerization using water as a polymerization medium.

In the present invention, it is preferred that the surface-modified copolymer (1) takes a particulate form. Therefore, it is preferred that the above carboxyl group-containing copolymer is also obtained in the particulate form. Such a particulate carboxyl group-containing copolymer can be produced directly, for example, by emulsion polymerization, suspension polymerization, precipitation polymerization, etc., wherein a radical polymerization initiator is used. In addition, it can also be obtained by forming a bulk copolymer produced previously into a particulate form or forming a copolymer in the particulate form from a copolymer solution. However, it is preferred to produce it by emulsion polymerization or suspension polymerization. It is particularly preferred to produce it by emulsion polymerization in view of particle size, uniformity of particle size, etc. In this case, an average particle size of the copolymer is preferably within the range of 20 to 1000 nm.

Examples of the radical polymerization initiators include organic peroxides, such as benzoyl peroxide, lauroyl peroxide, cumene hydroperoxide, paramenthan hydroperoxide, di-t-butyl peroxide, etc.; azo compounds such as azobisbutyronitrile, azobisisovaleronitrile, azobisisocapronitrile, etc.; inorganic peroxides such as potassium persulfate, ammonium persulfate, hydrogen persulfate, etc.; redox catalysts of organic peroxides or inorganic peroxides and reducing agents such as organic amine, ferrous sulfate, sodium sulfite, sodium thiosulfate, sodium form aldehyde sulfoxylate, L-ascorbic acid, sulfinic acid, etc.

Examples of the emulsifier to be used in the above emulsion polymerization include anionic surfactant, nonionic surfactant, cationic surfactant, amphoteric surfactant, etc. Among them, the anionic surfactant and nonionic surfactant are particularly preferred. These surfactants may be fluorine surfactants. In addition, a suspension stabilizer or a thickener can be used together with the emulsifier in order to adjust the viscosity of the reaction system, particle size, etc. in the emulsion polymerization.

Examples of the suspension stabilizer to be used in the suspension polymerization include water-soluble suspension stabilizers such as polyvinyl alcohol, sodium polyacrylate, methyl vinyl ether-maleic anhydride copolymer, water-soluble polyether, hydroxyethyl cellulose, carboxymethylcellulose, starch, gelatin, casein, alginate, etc.

In the copolymerization of the monomer mixture, the whole of the reaction components such as monomer, radical polymerization initiator, etc. may be added before the initiation of the reaction, or a part or all thereof may be added in several portions or continuously after the initiation of the reaction. The polymerization reaction is normally carried out in an atmosphere excluding oxygen (e.g. nitrogen, etc.) at 0°–60° C., but the operation condition such as temperature, stirring rate, etc. can be changed appropriately in the process of the reaction. The polymerization reaction can be carried out using a continuous or batch process. When the conversion degree of the polymerization reaction is less than 85%, the water developability of the composition are liable to be deteriorated.

Regarding the carboxyl group-containing copolymer, at least one part of a repeating unit of the aliphatic conjugate diene can also be hydrogenated. In this case, it is subjected to a hydrogenation treatment before the surface modification described hereinafter is carried out.

As the method for introducing a side chain into the surface of the copolymer fine particles to be used in the present invention, for example, there are combinations shown in Table 1.

TABLE 1

Method for introducing the side chain into the surface of polymer fine particles

| Functional group on the surface of polymer fine particle | Functional group of the compound for forming side chain |
|---|---|
| Carboxyl group | Epoxy group (esterification) |
| Carboxyl group | Acid chloride (synthesis of acid anhydride) |
| Carboxyl group | Isocyanate group (amidation) |
| Hydroxyl group | Isocyanate group (synthesis of urethane) |
| | Methylol group |
| Amino group | Acid chloride (amidation) |
| Amino group | Isocyanate group (synthesis of urea) |
| Epoxy group | Carboxyl group (esterification) |
| Acid anhydride group | Isocyanate group (amidation) |
| Carbonyl group (aldehyde group or ketone group) | Alkylidenephosphorane compound |

Examples of the side chain-forming compound to be used in the present invention will be shown below, but are not limited thereto. In addition, two or more types of these compounds for forming a side chain may be used in combination.

(Side chain-forming compound)

Examples of the compound for forming an epoxy group-containing side chain include monoglycidyl ethers such as 2,3-epoxy-1-propanol (i.e. glycidol), glycidyl methyl ether (i.e. 2,3-epoxypropyl methyl ether), glycidyl phenyl ether (i.e. phenyl glycidyl ether), 1,2-epoxybutane (i.e. 1,2-butylene oxide), glycidyl isopropyl ether, those having a structure represented by the following chemical formula:

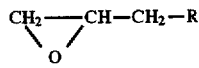

[wherein R is butyl, 2-ethylhexyl, decyl, stearyl, allyl, secbutylphenyl, t-butyl, $C_6H_5$—O—$(CH_2CH_2O)_5$—, $CH_3(CH_2)_{11}$—O—$(CH_2CH_2O)_{15}$—, $CH_3(CH_2)_{11}$— or $CH_3(CH_2)_{12}$—], etc.

Furthermore, examples of the compound for forming a side chain include acid chlorides such as propionyl chloride, butyryl chloride, isobutyryl chloride, valeryl chloride, hexanoyl chloride, heptanoyl chloride, octanoyl chloride, nonanoyl chloride, decanoyl chloride, undecanoyl chloride, lauroyl chloride, parmitoyl chloride, etc.

Examples of the compound for forming an isocyanate group (—N=C=O)-containing side chain include polyisocyanates compounds such as ethylene diisocyanate, propylene diisocyanate, tetramethylene diisocyanate, hexamethylene diisocyanate, 1-methyl-2,4-diisocyanate cyclohexane, 1-methyl-2,6-diisocyanate cyclohexane, ω,ω'-diisocyanate diethylbenzene, ω,ω'-diisocyanate dimethylaminotoluene, ω, ω'-diisocyanate dimethylxylene, ω, ω'-diisocyanate diethylxylene, lysine diisocyanate, 4,4-methylenebis (cyclohexyl isocyanate), 4,4-ethylenebis (cyclohexyl isocyanate), ω, ω'-diisocyanate-1,3-dimethylbenzene, ω, ω'-diisocyanate-1,4-dimethylbenzene, isophorone diisocyanate, 2,4-tolylene diisocyanate, 2,6-tolylene diisocyanate, 1,5-naphthalene diisocyanate, 4,4'-methylenebis (phenyl isocyanate), triphenylmethane triisocyanate or a polymer thereof. Among them, diisocyanate compounds are preferred, and compounds containing primary and secondary isocyanate groups are particularly preferred.

Examples of the compound for forming a hydroxyl group-containing side chain include alcohols such as methanol, ethanol, propanol, lauryl alcohol, stearyl alcohol, isopropyl alcohol, amyl alcohol, cyclohexanol, n-decanol, tetrahydrofurfuryl alcohol, etc.; diethylene oxide phenyl ether, etc. They may contain a branched structure, an aromatic ring or an ether group (—O—) in the molecule.

Examples of the compound for forming an amino group-containing side chain include amines, such as propylamine, butylamine, isobutylamine, hexylamine, octylamine, 3-ethoxypropylamine, 3-lauryloxypropylamine, benzylamine, etc. They may contain a branched structure, an aromatic ring, an ether group (—O—) or a tertiary amine in the molecule.

The functional group of the compound for forming a side chain can be introduced by utilizing the carboxyl group in the above carboxyl group-containing copolymer as well as other functional groups derived from the above monomers (i) to (iv) (e.g. hydroxyl group, amino group, etc.) and reacting a compound containing a group capable of reacting with these functional groups and a functional group of the compound for forming a side chain with the above carboxyl group-containing copolymer. In addition, the carboxyl group-containing copolymer containing various functional groups to be used for the production of the surface-modified copolymer (1) can be produced directly by copolymerizing the monomer mixture, or it can also be produced by subjecting a copolymer produced previously to a chemical workup.

The reaction proportion in case of introducing the functional group of the compound for forming a side chain into the above carboxyl group-containing copolymer varies depending on the amount of the functional group contained in the carboxyl group-containing copolymer, kind of the compound for forming a side chain, desired characteristics of the resin composition for flexographic printing plate material, etc. The amount of the compound for forming a side chain is 1 to 150 parts by weight, preferably 5 to 100 parts by weight, based on 100 parts by weight of the carboxyl group-containing copolymer. When the amount of the compound for forming a side chain is less than 1 part by weight, the effect for improving for the rubber elasticity, hardness and elongation of the printing material is not observed. On the other hand, when it exceeds 100 parts by weight, the effect is decreased.

When the carboxyl group-containing copolymer takes a particulate form, the reaction between the copolymer and the compound for forming a side chain can be carried out even if the copolymer is nonuniform system while maintaining the particulate form or uniform system wherein the copolymer is dissolved in a suitable solvent.

(Component (2))

Next, the photopolymerizable unsaturated monomer (2) as the second component constituting the resin composition for flexographic printing plate material of the present invention is a compound capable of polymerizing by light irradiation in the presence of the photopolymerization initiator (4) described hereinafter.

Examples of the photopolymerizable unsaturated monomer (2) include vinyl aromatic compounds such as styrene, α-methylstyrene, o-methylstyrene, m-methylstyrene, p-methylstyrene, p-t-butylstyrene, divinylbenzene, o-chlorostyrene, m-chlorostyrene, p-chlorostyrene, 1,1-diphenylethylene, p-methoxystyrene, N,N-dimethyl-p-aminostyrene, N,N-diethyl-p-aminostyrene, vinylpyridine, etc.; unsaturated nitriles such as (meth)acrylonitrile, α-chloroacrylonitrile, α-chloromethylacrylonitrile, α-methoxyacrylonitrile, α-ethoxyacrylonitrile, nitrile crotonate, nitrile cinnamate, dinitrile itaconate, dinitrile maleate, dinitrile fumarate, etc.; alkyl (meth)acrylates such as methyl (meth)acrylate, ethyl (meth)acrylate, n-propyl (meth)acrylate, isopropyl (meth)acrylate, n-butyl (meth) acrylate, isobutyl (meth)acrylate, sec-butyl (meth)acrylate, t-butyl (meth)acrylate, n-amyl (meth)acrylate, n-octyl (meth)acrylate, 2-ethylhexyl (meth)acrylate, lauryl (meth) acrylate, stearyl (meth)acrylate, etc.; unsaturated carboxylates such as methyl crotonate, ethyl crotonate, propyl crotonate, butyl crotonate, methyl cinnamate, ethyl cinnamate, propyl cinnamate, butyl cinnamate, dimethyl itaconate, diethyl itaconate, dimethyl maleate, diethyl maleate, dimethyl fumarate, diethyl fumarate, etc.; fluoroalkyl (meth)acrylates such as trifluoroethyl (meth)acrylate, pentafluoropropyl (meth)acrylate, heptafluorobutyl (meth) acrylate, etc.; hydroxyalkyl (meth)acrylate such as 2-hydroxyethyl (meth)acrylate, 2-hydroxypropyl (meth) acrylate, 3-hydroxypropyl (meth)acrylate, etc.; mono(meth) acrylates of polyalkylene glycols such as polyethylene glycol, polypropylene glycol, etc.; alkoxyalkyl (meth) acrylates such as 2-methoxyethyl (meth)acrylate, 2-ethoxyethyl (meth)acrylate, 2-methoxypropyl (meth) acrylate, 2-ethoxypropyl (meth)acrylate, 3-methoxypropyl (meth)acrylate, 3-ethoxypropyl (meth)acrylate, etc.; cyanoalkyl (meth)acrylates such as cyanoethyl (meth) acrylate, cyanopropyl (meth)acrylate, etc.; aryloxyalkyl (meth)acrylates such as 2-phenoxyethyl (meth)acrylate, 2-phenoxypropyl (meth)acrylate, 3-phenoxypropyl (meth) acrylate, etc.; mono(meth)acrylates of alkoxypolyalkylene glycols such as methoxypolyethylene glycol, ethoxypolyethylene glycol, methoxypolypropylene glycol, ethoxypolypropylene glycol etc.; mono(meth)acrylates of aryloxypolyalkylene glycols such as phenoxypolyethylene glycol, phenoxypolypropylene glycol, 1,4-butanediol, 1,5-pentanediol, 1,6-hexanediol, etc.; di(meth)acrylates of alkylene glycols such as ethylene glycol, propylene glycol, etc.; di(meth)acrylates of polyalkylene glycols (having 2 to 23 alkylene glycol units) such as polyethylene glycol, polypropylene glycol, etc.; di(meth)acrylates of polymers having hydroxyl groups at both terminal ends, such as both terminal hydroxypolybutadiene, both terminal hydroxypolyisoprene, both terminal hydroxybutadiene-acrylonitrile copolymer, both terminal hydroxypolycaprolactone, etc.; oligo(meth) acrylates such as di(meth)acrylate, tri(meth)acrylate or tetra (meth)acrylate of polyhydric (trihydric or more) alcohols, e.g. glycerin, 1,2,4-butanetriol, trimethylolalkane (e.g. alkane having 1 to 3 carbon atoms), pentaerythritol, etc.; oligo(meth)acrylates of polyalkylene glycol adducts of polyhydric (trihydric or more) alcohols; oligo(meth) acrylates of tetra (meth) acrylate, etc.; oilgo(meth)acrylates of cyclic polyhydric alcohols such as 1,4-cyclohexanediol, 1,4-benzenediol, 1,4-dihydroxyethylbenzene, etc.; oilgo(meth) acrylate prepolymers such as polyester (meth)acrylate, epoxy (meth)acrylate, urethane (meth)acrylate, alkyd resin (meth)acrylate, silicone resin (meth)acrylate, spiran resin (meth)acrylate, etc.; unsaturated carboxylic acids such as (meth)acrylic acid, crotonic acid, cinnamic acid, itaconic acid, itaconic anhydride, maleic acid, maleic anhydride, fumaric acid, citraconic acid, mesaconic acid, etc.; polyhydric esters such as dimethyl ester, diethyl ester, dipropyl ester, dibutyl ester, dihexyl ester or dioctyl ester of unsaturated polyhydric carboxylic acids such as itaconic acid, maleic acid, fumaric acid, citraconic acid, mesaconic acid, etc.; unsaturated amides such as (meth)acrylamide, N-hydroxymethyl (meth)acrylamide, N-(2-hydroxyethyl) (meth)acrylamide, N,N-bis(2-hydroxyethyl) (meth) acrylamide, N,N-methylenebis (meth)acrylamide, N,N-ethylenebis (meth)acrylamide, N,N-hexamethylenebis (meth)acrylamide, amide crotonate, amide cinnamate, etc.; halogenated vinyl compounds such as vinyl chloride, vinylidene chloride, etc.; unsaturated alcohol esters such as vinyl acetate, allyl acetate, divinyl phthalate, diallyl phthalate, etc.; cycloolefins such as cyclopentene, dicyclopentadiene, ethylidene-norbornene, norbornadiene, etc. In addition, two or more types of these compounds for forming a side chain may be used in combination. In the present invention, desired characteristics can be imparted to the resin composition for flexographic printing plate after photo-curing by selecting these monomers or a combination thereof, appropriately.

The fluidity of the resin composition for flexographic printing plate of the present invention can vary freely from wax form to low-viscosity liquid form, depending on the amount of the photopolymerizable unsaturated monomer (2). Accordingly, the amount of the photopolymerizable unsaturated monomer (2) to be formulated can be selected appropriately according to the service purpose of the resin composition for flexographic printing plate, and is preferably 10 to 100,000 parts by weight, more preferably 50 to 10,000 parts by weight, based on 100 parts by weight of the surface-modified copolymer (1). When the amount of the photopolymerizable unsaturated monomer (2) is less than 10 parts by weight, the strength of the resin composition for flexographic printing plate after photo-curing is liable to be decreased. On the other hand, when it exceeds 100,000 parts by weight, the shrinkage of the composition after photo-curing is large and it is difficult to satisfy water developability and water resistance of the composition after photo-curing, simultaneously. In addition, a degree of freedom for design of viscosity of the composition is liable to be small.

(Component (3))

Then, the amino group-containing compound as the third component constituting the resin composition for flexographic printing plate of the present invention is an organic compound containing at least one primary to tertiary amino group, in addition to ammonia.

Examples of the organic compound containing at least one primary to tertiary amino group include primary amines such as methylamine, ethylamine, propylamine, butylamine, etc.; secondary amines such as dimethylamine, methylethylamine, diethylamine, methylpropylamine, ethylpropylamine, dipropylamine, methylbutylamine, ethylbutylamine, propylbutylamine, dibutylamine, etc.; tertiary amines such as trialkylamines (e.g. trimethylamine, methyldiethylamine, dimethylethylamine, triethylamine, dimethylpropylamine, methylethylpropylamine, diethylpropylamine, methyldipropylamine, ethyldipropylamine, tripropylamine, dimethylbutylamine, methyldibutylamine, methylethylbutylamine, diethylbutylamine, ethyldibutylamine, methylpropylbutylamine, ethylpropylbutylamine, dipropylbutylamine, propyldibutylamine, tributylamine, etc.), alkylalkanol primary amines (e.g. dimethyl ethanolamine, methyl diethanolamine, diethyl ethanolamine, ethyl diethanolamine, etc.), trialkanolamines (e.g. triethanolamine, diethanolpropanolamine, ethanoldipropanolamine, tripropanolamine, etc.), N,N-dialkylaminoalkoxy alkanols (e.g. N,N-dimethylaminoethoxy ethanol, N,N-diethylaminoethoxy ethanol, N,N-dimethylaminoethoxy propanol N,N-diethylamino-ethoxy propanol, etc.), N,N-dialkylaminoalkyl (meth)acrylates (e.g. N,N-dimethylaminoethyl (meth)acrylate, dipropylaminoethyl (meth) acrylate, N,N-dimethylamnopropyl (meth)acrylate, N,N-diethylaminopropyl (meth)acrylate, N,N-diethylaminoethyl (meth)acrylate, N,N-dipropylaminopropyl (meth)acrylate, etc.), N,N-dialkylaminoalkoxyalkyl (meth)acrylates (e.g. N,N-dimethylaminoethoxyethyl (meth)acrylate, N,N-diethylaminoethoxyethyl (meth)acrylate, etc.), tertiary amino group-containing (meth)acrylamides (e.g. N-(N',N'-dimethylaminoethyl) (meth)acrylamide, N-(N',N'-diethylaminoethyl) (meth)acrylamide, N-(N',N'-dimethylaminopropyl) (meth)acrylamide N-N',N'-diethylaminopropyl) (meth) acrylamide, etc.), tertiary amino group-containing carbamates (e.g. N,N-dimethylaminoethyl-N'-(meth)acryloylcarbamate, N,N-diethylaminoethyl-N'-(meth)acryloylcarbamate, etc.); or a combination thereof.

Among the above amino group-containing compounds (3), the tertiary amines are preferred and provide excellent water developability. Particularly, compounds containing an α,β-ethylenically unsaturated group (e.g. tertiary amino group-containing (meth)acrylates, tertiary amino group-containing (meth)acrylamides, etc.) are preferred in view of the strength of the resin composition for flexographic printing plate after photo-curing.

The amount of the amino group-containing compound (3) to be formulated can be selected appropriately according to the purpose of the resin composition for flexographic printing plate, and is used so that an amount of the amino group may be preferably not less than 0.5 mol, more preferably not less than 0.8 mol, based on 1 mol of the carboxyl group in the surface-modified copolymer (1). When the amount of the amino group in the amino group-containing compound (3) is less than 0.5 mol, the water developability is often insufficient. On the other hand, even when the amount of the amino group exceeds 2 mols, the water developability are not improved.

In the present invention, the photopolymerizable unsaturated monomer (2) and the amino group-containing compound (3) can be the same compounds. In that case, the amount of the same compound to the photopolymerizable copolymer may be adjusted so that they satisfy the respective preferred ranges.

(Component (4))

Furthermore, the photopolymerization initiator as the fourth component constituting the resin composition for flexographic printing plate of the present invention is a compound for initiating or sensitizing a polymerization reaction between the surface-modified copolymer (1) and photopolymerizable unsaturated monomer (2) and, in the preferred embodiment of the present invention, a polymerization reaction of a compound containing an α,β-ethylenically unsaturated group in the amino group-containing compound (3) due to light irradiation.

Examples of the photopolymerization initiator (4) include α-diketones such as diacetyl, methylbenzoyl formate, benzyl, etc.; acyloins such as benzoin, pivaloin, etc.; acyloin ethers such as benzoin methyl ether, benzoin ethyl ether, benzoin isopropyl ether, benzoin isobutyl ether, etc.; polynuclear quinones such as anthraquinone, 2-ethylanthraquinone, 2-t-butylanthraquinone, 1,4-naphthoquinone, etc.; acetophenones such as acetophenone, 2-hydroxy-2-methyl-propiophenone, 1-hydroxycyclohexyl phenyl ketone, 2,2-dimethoxyphenyl acetophenone, 2,2-diethoxyacetophenone, trichloroacetophenone, etc.; benzophenones such as benzophenone, methyl-o-benzoyl benzoate, Michler's ketones, etc.; xanthones such as xanthone, thioxanthone, 2-chlorothioxanthone, etc.

The amount of the photopolymerization initiator (4) to be formulated is preferably 0.1 to 20 parts by weight, more preferably 1 to 10 parts by weight, based on 100 parts by weight of the surface-modified copolymer (1). When the amount of the photopolymerization initiator (4) is less than 0.1 part by weight, the photo-curing of the resin composition for flexographic printing plate is likely to become insufficient. On the other hand, even when it exceeds 20 parts by weight, the whole photopolymerization initiator (4) does not take part in the photo-curing and, therefore, it is uneconomical. The photopolymerization initiator may not be dispersed uniformly, because its compatibility with the photopolymerizable unsaturated monomer (2) and the amino group-containing compound (3) is inferior.

In addition, various additives may be optionally formulated to the resin composition for flexographic printing plate of the present invention, and examples of the additive include thermal addition polymerization inhibitor acting as a storage stabilizer.

Examples of the thermal addition polymerization inhibitor include hydroxy aromatic compounds such as hydroquinone, hydroquinone monomethyl ether, mono-t-butylhydroquinone, catechol, p-t-butyl catechol, p-methoxyphenol, p-t-butyl catechol, 2,6-di-t-butyl-p-cresol, 2,6-di-t-butyl-m-cresol, pyrogallol, β-naphthol, etc.; quinones such as benzoquinone, 2,5-diphenyl-p-benzoquinone, p-toluquinone, p-xyloxylo(?), etc.; nitro or nitrone compounds such as nitrobenzene, m-dinitrobenzene, 2-methyl-2-nitrosopropane, α-phenyl-t-butylnitrone, 5,5-dimethyl-1-pyrroline-1-oxide, etc.; amines such as chloranil-amine, diphenylamine, diphenylpicrylhydrazine, phenol-α-naphthylamine, pyridine, phenothiazine, etc.; sulfides such as dithiobenzoyl sulfide, dibenzyl tetrasulfide, etc.; unsaturated compounds such as α-methylthioacrylonitrile, etc.; thiazine dyes such as thionine blue, toluidine blue, methylene blue, etc.; stabilized radicals such as 1,1-diphenyl-2-picrylhydrazyl, 1,3,5-triphenyldazyl, 4-hydroxy-2,2,6,6-tetramethylpiperidine-1-oxyl, 2,6-di-t-butyl-α-(3,5-di-t-butyl)-4-oxo-2,5-cyclohexadiene-1-ylidine-p-trioxyl, etc.

The amount of the thermal addition polymerization inhibitor to be formulated is, for example, about 0.001 to 2.0 parts by weight, based on 100 parts by weight of the whole resin composition for flexographic printing plate.

Furthermore, examples of the other additive include antioxidants, fillers, reinforcers, plasticizers, halation inhibitors, adhesion auxiliaries, etc.

The resin composition for flexographic printing plate of the present invention can be obtained by sufficiently mixing the surface-modified copolymer (1), the photopolymerizable unsaturated monomer (2), the amino group-containing compound (3) and the photopolymerization initiator (4) together with various additives to be optionally formulated under pressure, for example, using a kneader, an intermixer, etc. The properties of the resulting composition can be adjusted freely from the wax-like form having no fluidity to low-density liquid form having good fluidity, and a degree of fluidity is selected appropriately according to the service purpose of the composition. When the low-viscosity composition is particularly preferred, a suitable amount of a solvent may be used for the composition.

When the flexographic printing plate is made from the resin composition for flexographic printing plate of the present invention, various methods can be used according to the degree of fluidity of the composition. For example, in case of composition having no fluidity or low fluidity, a plate having a desired film thickness can be obtained by passing it through between spacers having a suitable distance, or applying it on a suitable substrate using an application device such as roll coater, or subjecting it to a compression molding, an extrusion molding, a calendar molding, etc.

In addition, in case of the composition having a good fluidity, the plate can be obtained by applying it on the substrate using a suitable application method such as roll coating, calendar coating, doctor blade coating, air knife coating, etc. Particularly, it is useful as a resist suitable for spin coating.

A clear relief image can be formed by exposing the flexographic printing plate or resist thus obtained to chemically active light (e.g. ultraviolet light, etc.) through a negative film having a desired pattern, washing the non-exposed area with water to remove, followed by drying. In this case, it can be optionally exposed to light again after drying.

According to the present invention, there is provided a resin composition for flexographic printing plate, which is superior to a conventional product in rubber elasticity, hardness and elongation among physical properties required exceedingly for a water developing type flexographic printing plate material, and which is also equivalent or superior to a conventional product in water developability.

EXAMPLES

The following Examples and Comparative Examples further illustrate the present invention in detail but are not to be construed to limit the scope thereof (Example 1)

(1) Surface-modified copolymer

A monomer mixture having a composition of butadiene:methacrylic acid:divinylbenzene:methyl methacrylate [=80:6.5:1.0:12.5 (molar %)] was subjected to emulsification polymerization in a 20 liter autoclave, using sodium lauryl sulfate as an emulsifier and potassium persulfate as a polymerization initiator. After the polymerization conversion degree of the whole monomer reached 90%, hydroxylamine sulfate was added in the amount of 0.2 part by weight, based on 100 parts by weight of the monomer, to terminate the polymerization. Then, the reaction solution was heated and subjected to steam distillation under a reduced pressure to remove the residual monomer. The particle size of the resulting copolymer latex was measured by a normal method. As a result, the average particle size was 71 nm.

Then, 1.7 parts by weight of glycidyl isopropyl ether was added to the copolymer latex containing 100 parts by weight of the carboxyl group-containing copolymer in the presence of a catalytic amount of tetra-n-butylammonium bromide, and the mixture was reacted at 70° C. for 10 hours. The reaction product was solidified with salting-out using calcium chloride, washed with water and dried to produce a particulate surface-modified copolymer (1) wherein an isopropyl group is introduced through an ester bond.

(Resin composition for flexographic printing plate)

To 100 parts by weight of the surface-modified copolymer (1) thus produced as described above, 10 parts by weight of nonaethylene glycol methacrylate and 10 parts by weight of trimethylolpropane trimethacrylate as a photopolymerizable unsaturated monomer (2), 10 parts by weight of N,N-dimethylaminopropyl acrylamide as an amino group-containing compound (3), 3 parts by weight of 2,2-dimethoxyphenyl acetophenone as a photopolymerization initiator (4) and 0.5 part by weight of p-t-butyl catechol as a storage stabilizer were added, and the mixture was stirred in a pressure kneader maintained at 50° C. for 30 minutes to prepare a resin composition for flexographic printing plate material. The resulting composition was transparent and showed a wax-like form.

(Evaluation)

A flexographic printing plate material having a thickness of 0.5 mm was formed on a polyester sheet, using the resin composition for flexographic printing plate thus prepared as described above.

The resin layer of the above printing plate was subjected to brushing in hot water at 45° C. using a developing device (Model JOW-A-4P, manufactured by Nihon Denshi Seiki Co., Ltd.) to measure the time which is required for the resin layer to eluate completely (hereinafter referred to as a "time for required for elution"), thereby evaluating the water developability of the resin composition for flexographic printing plate material.

In addition, the above printing plate was exposed to light for six minutes using an exposing device (Model JE-A-SS, manufactured by Nihon Denshi Seiki Co., Ltd.) and the tensile strength, breaking extension and impact resilience were measured according to JIS K 6301. As a result, they were excellent anti showed an excellent balance of characteristics.

The results are shown in Table 2.

TABLE 2

| Component | Photosensitive resin composition | Example No. 1 | 2 | 3 | 4 | Comparative Example No. 1 |
|---|---|---|---|---|---|---|
| (1) | Surface-modified copolymer (parts by weight) | 100 | 100 | 100 | 100 | 100 |
| | Composition of carboxyl group-containing copolymer (*) | | | | | |
| | (i) Butadiene | 80 | 78.6 | 80 | 78.6 | 80 |
| | (ii) Methacrylic acid | 6.5 | 6.7 | 6.5 | 6.7 | 6.5 |
| | (iii) Divinylbenzene | 1.0 | 1.0 | — | 1.0 | 1.0 |
| | Ethylene glycol dimethacrylate | — | — | 1.0 | — | — |
| | (iv) 2-Hydroxyethyl methacrylate | — | 1.0 | — | 1.0 | — |
| | Methyl methacrylate | 12.5 | 12.7 | — | — | 12.5 |
| | Ethyl acrylate | — | — | 12.5 | 12.7 | — |
| | Compound for forming side chain (parts by weight) | | | | | |
| | Glycidyl isopropyl ether | 1.7 | — | 1.7 | — | — |
| | Isocyanate half block copolymer | — | 4.4 | — | 4.4 | — |
| (2) | Photopolymerizable unsaturated monomer | | | | | |

TABLE 2-continued

| Component | Photosensitive resin composition | Example No. 1 | 2 | 3 | 4 | Comparative Example No. 1 |
|---|---|---|---|---|---|---|
| | (parts by weight) | | | | | |
| | Nonaethylene glycol methacrylate | 10 | 10 | 10 | 10 | 10 |
| | Trimethylolpropane trimethacrylate | 10 | 10 | 10 | 10 | 10 |
| (3) | Amino group-containing compound (parts by weight) | | | | | |
| | N,N-dimethylaminopropyl acrylamide | 10 | 10 | 10 | 10 | 10 |
| (4) | Photopolymerization initiator (parts by weight) | | | | | |
| | 2,2-Dimethoxyphenyl acetophenone | 3 | 3 | 3 | 3 | 3 |
| — | Storage stablizier (parts by weight) | | | | | |
| | p-t-Butylcatechol | 0.5 | 0.5 | 0.5 | 0.5 | 0.5 |
| Evaluation | Time required for elution (seconds) | 80 | 90 | 80 | 90 | 60 |
| | Tensile strength (kgf/cm$^2$) | 22 | 22 | 24 | 26 | 22 |
| | Elongation (%) | 70 | 80 | 80 | 85 | 40 |
| | Impact resilience | 34 | 34 | 34 | 35 | 33 |

(*) Molar % of monomer at the time of copolymerization (Example 2)

According to the same manner as that described in Example 1, a monomer mixture having a composition of butadiene:methacrylic acid:divinylbenzene:2-hydroxyethyl methacrylate:methyl methacrylate [=78.6:6.7:1.0:1.0:12.7 (molar %)] was subjected to emulsification polymerization to obtain a copolymer latex having an average particle size of 73 nm. According to the same manner as that described in Example 1, the resulting copolymer latex was salted-out, washed with water and dried to obtain a crumb-like carboxyl group-containing copolymer.

Equimolar hexyl alcohol and tolylene diisocyanate (TDI) were reacted separately to synthesize a hexyl alcohol half block copolymer of isocyanate.

4.4 Parts by weight of the above isocyanate half block copolymer was added to 100 parts by weight of the above carboxyl group-containing copolymer in the presence of a catalytic amount of di-n-butyltin dilaurate, and the mixture was reacted in a kneader maintained at 50° C. for 10 minutes to produce a surface-modified copolymer (1) wherein a hexyl group is introduced through an urethane bond.

The components shown in Table 2 were formulated, and then the resin composition for flexographic printing plate was prepared and evaluated according to the same manner as that described in Example 1.

As a result, the composition was superior in water developability, tensile strength, breaking extension and impact resilience and showed an excellent balance of characteristics.

The results are shown in Table 2.

(Example 3)

According to the same manner as that described in Example 1, a monomer mixture having a composition of butadiene:methacrylic acid:ethylene glycol dimethacrylate:ethyl acrylate [=80:6.5:1.0:12.5 (molar %)] was subjected to emulsification polymerization to obtain a copolymer latex having an average particle size of 65 nm. According to the same manner as that described in Example 1 except for using this copolymer latex, the surface-modified copolymer (1) was produced, and the resin composition for flexographic printing plate was prepared and evaluated.

As a result, the composition was superior in water developability, tensile strength, breaking extension and impact resilience and showed an excellent balance of characteristics.

The results are shown in Table 2.

(Example 4)

According to the same manner as that described in Example 1, a monomer mixture having a composition of butadiene:methacrylic acid:divinylbenzene:2-hydroxyethyl methacrylate:ethyl methacrylate [=78.6:6.7:1.0:1.0:12.7 (molar %)] was subjected to emulsification polymerization to obtain a copolymer latex having an average particle size of 80 nm. According to the same manner as that described in Example 1, this copolymer latex was salted-out, washed with water and dried to obtain a crumb-like carboxyl group-containing copolymer.

According to the same manner as that described in Example 2, an isocyanate half block copolymer was synthesized separately.

The above carboxyl group-containing copolymer was dissolved in chloroform to prepare an uniform solution. Then, 4.4 Parts by weight of the above isocyanate half block copolymer was added to 100 parts by weight of the copolymer in the presence of a catalytic amount of di-n-butyltin dilaurate, and the mixture was reacted under reflux to produce a surface-modified copolymer (1) wherein a methacryloyl group was introduced through an urethane bond.

Then, the components shown in Table 2 were formulated, and the resin composition for flexographic printing plate was prepared and evaluated according to the same manner as that described in Example 1.

As a result, the composition was superior in water developability, tensile strength, breaking extension and impact resilience and showed an excellent balance of characteristics.

The results are shown in Table 2.

(Example 5)

According to the same manner as that described in Example 1 except for using 80 parts by weight of the surface-modified copolymer (1) used in Example 1 and 20 parts by weight of a styrene-isoprene-styrene block copolymer in place of 100 parts by weight of the above surface-modified copolymer (1), a resin composition for flexographic printing plate was prepared and evaluated.

The results are shown in Table 3.

TABLE 3

| Component | Photosensitive resin composition | Example No. 5 | Example No. 6 | Comparative Example No. 2 |
|---|---|---|---|---|
| (1) | Surface-modified copolymer (parts by weight) | 80 | 70 | 100 |
| | Composition of carboxyl group-containing copolymer (*) | | | |
| | (i) Butadiene | 80 | 78.6 | 80 |
| | (ii) Methacrylic acid | 6.5 | 6.7 | 6.5 |
| | (iii) Divinylbenzene | 1.0 | 1.0 | 1.0 |
| | Ethylene glycol dimethacrylate | — | — | — |
| | (iv) 2-Hydroxyethyl methacrylate | — | 1.0 | — |
| | Methyl methacrylate | 12.5 | 12.7 | 12.5 |
| | Ethyl acrylate | — | — | — |
| | Compound for forming side chain (parts by weight) | | | |
| | Glycidyl isopropyl ether | 1.7 | — | — |
| | Isocyanate half block copolymer | — | 4.4 | — |
| (2) | Photopolymerizable unsaturated monomer (parts by weight) | | | |
| | Nonaethylene glycol methacrylate | 10 | 10 | 10 |
| | Trimethylolpropane trimethacrylate | 10 | 10 | 10 |
| (3) | Amino group-containing compound (parts by weight) | | | |
| | N,N-dimethylaminopropyl acrylamide | 10 | 10 | 10 |
| (4) | Photopolymerization initiator (parts by weight) | | | |
| | 2,2-Dimethoxyphenyl acetophenone | 3 | 3 | 3 |
| (5) | Styrene-isoprene-styrene block copolymer | 20 | 30 | 20 |
| — | Storage stablizier (parts by weight) | | | |
| | p-t-Butylcatechol | 0.5 | 0.5 | 0.5 |
| Evaluation | Time required for elution (seconds) | 150 | 140 | 130 |
| | Tensile strength (kgf/cm$^2$) | 42 | 32 | 42 |
| | Elongation (%) | 100 | 120 | 60 |
| | Impact resilience | 35 | 32 | 32 |

(*) Molar % of monomer at the time of copolymerization (Example 6)

According to the same manner as that described in Example 2 except for using 70 parts by weight of the surface-modified copolymer (1) used in Example 2 and 30 parts by weight of a styrene-isoprene-styrene block copolymer in place of 100 parts by weight of the above surface-modified copolymer (1), a resin composition for flexographic printing plate was prepared and evaluated.

The results are shown in Table 3.

(Comparative Example 1)

According to the same manner as that described in Example 1 except for introducing no side chain into the carboxyl group-containing copolymer, a resin composition for flexographic printing plate was prepared and evaluated.

As a result, the composition was superior in water developability, but the tensile strength was drastically decreased and the breaking extension was also low.

The results are shown in Table 2.

(Comparative Example 2)

According to the same manner as that described in Example 5 except for introducing no side chain into the carboxyl group-containing copolymer, a resin composition for flexographic printing plate was prepared and evaluated.

The results are shown in Table 3.

What is claimed is:

1. A resin composition for flexographic printing plate, comprising:

(1) a particulate copolymer which is surface-modified by reacting a carboxyl group-containing particulate copolymer with a side chain-forming compound containing a functional group reactive with a carboxyl group and a branched- or straight-chain saturated hydrocarbon group having 1 to 24 carbon atoms, said particulate copolymer being obtained by polymerizing a monomer mixture containing (i) 10 to 95 molar % of an aliphatic conjugate diene, (ii) 0.1 to 30 molar % of a carboxyl group-containing ethylenically unsaturated monomer, (iii) 0.1 to 20 molar % of a compound containing at least two polymerizable unsaturated groups and (iv) 0 to 30 molar % of a polymerizable monomer other than the monomers (i)–(iii) (provided that the total amount of the components (i), (ii), (iii) and (iv) is 100 molar %);

(2) a photopolymerizable unsaturated monomer;

(3) an amino group-containing compound; and (4) a photopolymerization initiator.

2. The resin composition according to claim 1 wherein said aliphatic conjugated diene (i) is selected from the group consisting of butadiene, isoprene, 1,3-pentadiene, 1,3-hexadiene, 2,3-dimethylbutadiene, 4,5-diethyl-1,3-octadiene, 3-butyl-1,3-octadiene, chloroprene, 2,3-dichlorobutadiene, 1,3-cyclopentadiene or a combination thereof.

3. The resin composition according to claim 1 wherein said carboxyl group-containing ethylenically unsaturated monomer (ii) is selected from the group consisting of (meth)acrylic acid, crotonic acid, cinnamic acid, itaconic acid, itaconic anhydride, maleic acid, maleic anhydride, fumaric acid, citraconic acid and mesaconic acid.

4. The resin composition according to claim 1 wherein said containing two polymerizable unsaturated groups (iii) is selected from the group consisting of di(meth)acrylates of alkylene glycols, di(meth)acrylates of alkylene glycols, di(meth)acrylates of polymers having hydroxyl groups at both terminal ends, oligo(meth)acrylates, oligo(meth) acrylates of polyalkylene glycol adducts of polyhydric (trihydric or more) alcohols; oligo(meth)acrylates of cyclic polyhydric alcohols, oligo(meth)acrylate prepolymers, bis (meth)acrylamides, polyvinyl aromatic compounds, unsaturated alcohol esters of polyhydric carboxylic acids, polyfunctional unsaturated ethers, and a combination thereof.

5. The resin composition according to claim 1 wherein said carboxyl group-containing copolymer is in the form of particulate and has an average particle size of 20 to 1,000 nm.

6. The resin composition according to claim 1 wherein said side chain-forming compound containing a functional group reactive with a carboxyl group and a branched- or straight-chain saturated hydrocarbon group having 1 to 24 carbon atoms is selected from the group consisting of monoglycidyl ethers, acid chlorides, polyisocyanates, alcohols, amines, and a mixture thereof.

7. The resin composition according to claim 1 wherein said side chain-forming compound is used in an amount of 1 to 150 parts by weight based on 100 parts by weight of the carboxyl group-containing copolymer.

8. The resin composition according to claim 1 wherein said photopolymerizable unsaturated monomer (2) is employed in an amount of 10 to 100,000 parts by weight based on 100 parts by weight of the surface-modified copolymer (1).

9. The resin composition according to claim 1 wherein said amino group-containing compound (3) is selected from the group consisting of methylamine, ethylamine, propylamine, butylamine, dimethylamine, methylethylamine, diethylamine, methylpropylamine, ethylpropylamine, dipropylamine, methylbutylamine, ethylbutylamine, propylbutylamine, dibutylamine, trimethylamine, methyldiethylamine, dimethylethylamine, triethylamine, dimethylpropylamine, methylethylpropylamine, diethylpropylamine, methyldipropylamine, ethyidipropylamine, tripropylamine, dimethylbutylamine, methyldibutylamine, methylethylbutylamine, diethylbutylamine, ethyldibutylamine, methylpropylbutylamine, ethylpropylbutylamine, dipropylbutylamine, propyldibutylamine, tributylamine, dimethyl ethanolamine, methyl diethanolamine, diethyl ethanolamine, ethyl diethanolamine, triethanolamine, diethanolpropanolamine, ethanoldipropanolamine, tripropanolamine, N,N-dimethylaminoethoxy ethanol, N,N-diethylaminoethoxy ethanol, N,N-dimethylaminoethoxy propanol N,N-diethylamino-ethoxy propanol, N,N-dimethylaminoethyl (meth)acrylate, dipropylaminoethyl (meth)acrylate, N,N-dimethylaminopropyl (meth) acrylate, N,N-diethylaminopropyl (meth)acrylate, N,N-diethylaminoethyl (meth)acrylate, N,N-dipropylaminopropyl (meth)acrylate, N,N-dimethylaminoethoxyethyl (meth)acrylate, N,N-diethylaminoethoxyethyl (meth)acrylate, N-(N',N'-dimethylaminoethyl) (meth)acrylamide, N-(N',N'-diethylaminoethyl) (meth)acrylamide, N-(N',N'-dimethylaminopropyl) (meth)acrylamide N-N',N'-diethylaminopropyl) (meth) acrylamide, N,N-dimethylaminoethyl-N'-(meth)acryloylcarbamate, N,N-diethylaminoethyl-N'-(meth)acryloylcarbamate, and a combination thereof.

10. The resin composition according to claim 1 wherein said amino group-containing compound (3) is employed in an amount of not less than 0.5 mol based on 1 mol of the carboxyl group in the surface-modified copolymer (1).

11. The resin composition according to claim 1 wherein said photopolymerization initiator (4) is present in an amount of 0.1 to 20 parts by weight based on 100 parts by weight of the surface-modified copolymer (1).

12. A particulate copolymer which is surface-modified by reacting a carboxyl group-containing particulate copolymer with a side chain-forming compound containing a functional group reactive with a carboxyl group and a branched- or straight-chain saturated hydrocarbon group having 1 to 24 carbon atoms, said particulate copolymer being obtained by polymerizing a monomer mixture containing (i) 10 to 95 molar % of an aliphatic conjugate diene, (ii) 0.1 to 30 molar % of a carboxyl group-containing ethylenically unsaturated monomer, (iii) 0.1 to 20 molar % of a compound containing at least two polymerizable unsaturated groups and (iv) 0 to 30 molar % of a polymerizable monomer other than the monomers (i)–(iii) the total amount of the components (i), (ii), (iii) and (iv) being 100 molar %.

13. The particulate copolymer according to claim 12 wherein said aliphatic conjugated diene (i) is selected from the group consisting of butadiene, isoprene, 1,3-pentadiene, 1,3-hexadiene, 2,3-dimethylbutadiene, 4,5-diethyl-1,3-octadiene, 3-butyl-1,3-octadiene, chloroprene, 2,3-dichlorobutadiene, 1,3-cyclopentadiene or a combination thereof.

14. The particulate copolymer according to claim 12 wherein said carboxyl group-containing ethylenically unsaturated monomer (ii) is selected from the group consisting of (meth)acrylic acid, crotonic acid, cinnamic acid, itaconic acid, itaconic anhydride, maleic acid, maleic anhydride, fumaric acid, citraconic acid and mesaconic acid.

15. The particulate copolymer according to claim 12 wherein said compound containing at least two polymerizable unsaturated groups (iii) is selected from the group consisting of di(meth)acrylates of alkylene glycols, di(meth) acrylates of alkylene glycols, di(meth)acrylates of polymers having hydroxyl groups at both terminal ends, oligo(meth) acrylates, oligo(meth)acrylates of polyalkylene glycol adducts of polyhydric (trihydric or more) alcohols; oligo (meth)acrylates of cyclic polyhydric alcohols, oligo(meth) acrylate prepolymers, bis(meth)acrylamides, polyvinyl aromatic compounds, unsaturated alcohol esters of polyhydric carboxylic acids, polyfunctional unsaturated ethers, and a combination thereof.

16. The particulate copolymer according to claim 12 wherein said carboxyl group-containing copolymer is in the form of particulate and has an average particle size of 20 to 1,000 nm.

17. The particulate copolymer according to claim 12 wherein said side chain-forming compound containing a functional group reactive with a carboxyl group and a branched- or straight-chain saturated hydrocarbon group having 1 to 24 carbon atoms is selected from the group consisting of monoglycidyl ethers, acid chlorides, polyisocyanates, alcohols, amines, and a mixture thereof.

18. The particulate copolymer according to claim 12 wherein said side chain-forming compound is used in an amount of 1 to 150 parts by weight based on 100 parts by weight of the carboxyl group-containing copolymer.

19. A process for producing a flexographic printing plate material, which comprises applying a photopolymerizable resin composition on a substrate, wherein the photopolymerizable resin composition comprises (1) a particulate copolymer which is surface-modified by reacting a carboxyl group-containing particulate copolymer with a compound containing a functional group reactive with a carboxyl group and a branchedor straight-chain saturated hydrocarbon group having 1 to 24 carbon atoms, said particulate copolymer being obtained by polymerizing a monomer mixture containing (i) 10 to 95 molar % of an aliphatic conjugate diene, (ii) 0.1 to 30 molar % of a carboxyl group-containing ethylenically unsaturated monomer, (iii) 0.1 to 20 molar % of a compound containing at least two polymerizable unsaturated groups and (iv) 0 to 30 molar % of a polymerizable monomer other than the monomers (i)–(iii) (provided that the total amount of the components (i), (ii), (iii) and (iv) is 100 molar %);

(2) a photopolymerizable unsaturated monomer;

(3) an amino group-containing compound; and (4) a photopolymerization initiator.

20. A flexographic printing plate obtained according to the process of claim 19.

21. A process for forming a relief image, which comprises exposing the flexographic printing plate material of claim 20 to light through a negative film, followed by developing.

* * * * *